(12) United States Patent
Talvitie et al.

(10) Patent No.: US 7,020,443 B2
(45) Date of Patent: Mar. 28, 2006

(54) SYSTEM FOR MEASURING A RADIO FREQUENCY SIGNAL IN A WIRELESS STATION AND A WIRING BOARD SWITCH

(75) Inventors: Olli Talvitie, Tampere (FI); Urpo Nokkonen, Tampere (FI); Jane Lehtilä, Tampere (FI); Antti Hentinen, Ruutana (FI); Risto Pirhonen, Tampere (FI); Jukka Eerikäinen, Tampere (FI)

(73) Assignee: Nokia Mobile Phones, Ltd., Espoo (FI)

( * ) Notice: Subject to any disclaimer, the term of this patent is extended or adjusted under 35 U.S.C. 154(b) by 626 days.

(21) Appl. No.: 09/808,536

(22) Filed: Mar. 14, 2001

(65) Prior Publication Data
US 2001/0023176 A1    Sep. 20, 2001

(30) Foreign Application Priority Data
Mar. 15, 2000    (FI) .................................. 20000594

(51) Int. Cl.
*H04B 17/00*    (2006.01)
(52) U.S. Cl. ................. 455/67.14; 455/67.11; 455/66.1; 455/423; 455/115.1; 455/115.2; 455/226.1; 324/95; 324/501; 324/527; 324/750; 343/701; 343/702; 343/703
(58) Field of Classification Search ............. 455/67.11, 455/66.1, 115.1, 67.14, 115.2, 226.1, 67.4; 343/700–703; 324/95, 501, 527, 528, 750
See application file for complete search history.

(56) References Cited

U.S. PATENT DOCUMENTS

| | | | |
|---|---|---|---|
| 4,286,335 A | | 8/1981 | Eichler et al. ................ 455/89 |
| 4,315,330 A | * | 2/1982 | Brickman et al. .......... 370/241 |
| 4,319,353 A | * | 3/1982 | Alvarez et al. ............. 370/321 |
| 5,365,027 A | * | 11/1994 | Marvet et al. ............ 200/16 D |
| 5,726,566 A | * | 3/1998 | Quist et al. .................... 324/95 |

(Continued)

FOREIGN PATENT DOCUMENTS

| | | |
|---|---|---|
| EP | 0764997 A1 | 3/1997 |
| EP | 1009067 | 6/2000 |

OTHER PUBLICATIONS

Patent Abstracts of Japan document No. 10125410, English translation of the Abstract attached.

(Continued)

*Primary Examiner*—Marceau Milord
(74) *Attorney, Agent, or Firm*—Perman & Green, LLP.

(57) ABSTRACT

The invention relates to a method for measuring a radio frequency signal in a wireless station (1). In this method, radio frequency power is measured by means of testing equipment (6, 7, 12), which includes at least a testing apparatus (7), a measuring head (6) and means (12) for transmitting electrical signals between the testing apparatus (7) and measuring head (6). The wireless station (1) includes at least one radio part (8), a wiring board (2), an antenna (5) and switching means (3, 22). This test switch has at least an first position, in which the radio frequency signal is directed between the radio part (8) of the wireless station (1) and the antenna (5), and a second position, in which the radio frequency signal is directed between the radio part (8) of the wireless station (1) and the testing apparatus (7) via the switching means (3, 22) and the measuring head (6). A switching aperture (4) has been formed in the wiring board essentially at least partly at the location of the switching means (3, 22), through which aperture the switching means (3, 22) is switched to the second position with the measuring head (6).

21 Claims, 8 Drawing Sheets

U.S. PATENT DOCUMENTS

| | | | |
|---|---|---|---|
| 5,768,689 A * | 6/1998 | Borg | 455/67.14 |
| 5,884,195 A | 3/1999 | Gomez et al. | 455/572 |
| 5,923,297 A * | 7/1999 | Kim et al. | 343/702 |
| 6,400,965 B1 * | 6/2002 | Phillips et al. | 455/558 |
| 6,469,673 B1 * | 10/2002 | Kaiponen | 343/703 |
| 6,507,737 B1 * | 1/2003 | Laham et al. | 455/423 |
| 6,542,731 B1 * | 4/2003 | Alos | 455/411 |

OTHER PUBLICATIONS

Patent Abstracts of Japan document No. 09257852, English translation of the Abstracts enclosed.

* cited by examiner

SYSTEM FOR MEASURING A RADIO FREQUENCY SIGNAL IN A WIRELESS STATION AND A WIRING BOARD SWITCH

The present invention relates to a wireless system according to the preamble of claim 1. The invention also relates to a method according to the preamble of claim 11.

The radio frequency power of a transmitter can be measured, for example, by coupling to the output of the transmitter a device, a test load, which converts essentially all the power fed by the transmitter to the output into heat, whereupon the power can be calculated from the temperature change. A generally used method is to use a thermocouple, which comprises two pieces of different metals joined together, in which the temperature causes a small voltage (so-called thermo voltage) to be created in the joint between the metals. This voltage, which is created in the joint, is very accurately proportional to the temperature of the joint. However, this method has the problem that it is very slow and expensive, especially with high frequencies. Measurement methods based on temperature are the most accurate of the prior art methods for determining the radio frequency power, but the problems of these methods are unreasonable with regard to the benefit gained from them.

A general solution, by which the use of methods based on temperature can be avoided, is the measurement of power by means of a diode. Then the output of the wireless station is indicated in a diode and the indicated voltage is amplified, whereupon the radio frequency power can be calculated. The radio frequency power (P) can be calculated by squaring the obtained voltage (V) and multiplying the result by a suitable coefficient (for example, $P=V^2(1.25)$). This method works well, provided that the connection between the transmitter and the power meter is good. However, making a sufficiently reliable connection of good quality between the transmitter and the power meter at 900 MHz, for instance, is not a simple task. The connector and the test load may have the effect that the diode creates only randomly a voltage which is proportional to the power. This is due to the fact that the diode only indicates the voltage of the output of the transmitter, from which the power is obtained by assuming that the current of the transmitter is proportional to the voltage. This is the case only when the resistive load coupled to the output of the transmitter is essentially as high as the self-impedance of the output of the transmitter.

The situation becomes even more complicated when radio frequency power should be measured from a transmitter using a digital modulation, such as TDMA. For example, the output of the transmitter of a GSM wireless station is to a great extent formed of bursts, and the bursts are so short that it is not possible to follow the outcoming power with ordinary linear power meters. Even if it were possible, it would not be possible to conclude from the measurement result formed by the power meter which conversion formula should be used to convert the measurement result back to power. One solution would be to use testing equipment, which use efficient means of signal processing to calculate the radio frequency power directly from the regenerated modulation.

Conventionally, the transmitters of wireless stations have been tuned, tested and serviced in service facilities by using an external antenna connector or by replacing the antenna with a separate measurement connector, which forms a galvanic coupling between the wireless station and the testing equipment. Wireless stations with a built-in antenna do not usually have such an external antenna connector. In that case, a less accurate RF (Radio Frequency) connector must be used, whereby the radio frequency power or other property to be measured, such as power, frequency, sensitivity, bit error rate or modulation spectrum, is measured from the wiring board of the wireless station, although the wireless station's own antenna has not been disconnected. Especially in type approval and in the development of prototypes, these measurements of a radio frequency signal should be carried out very accurately and without the need to solder extra coaxial cables on the wiring board or to use an inaccurate RF connector.

The wiring board can also include a test switch, which has preferably two different positions. When this test switch is in the operating position, the radio frequency signal proceeds from the wiring board of the wireless station to the wireless station's own antenna. When radio frequency power should be measured from the wireless station, this test switch is switched to the testing position with a measuring head, whereupon the wireless station's own antenna is disconnected to improve measurement accuracy. Then the radio frequency signal proceeds from the transmitter of the wireless station via the switch and the measuring head to the testing equipment. When this switch is in the operating position, the radio frequency signal proceeds via the test switch to the wireless station's own antenna. This method provides much more accurate results than a method in which the antenna is not disconnected. The test switch described above has the drawback that this test switch should be located outside the RF shield used in the radio frequency parts of the wireless station, and the measurement should be carried out from the side of the wiring board where the test switch is. In practice, this means that the wireless station should be dismantled for the duration of the measurement.

It is a common tendency to make the wiring boards of wireless stations one-sided by soldering components on one side of the wiring board only. In spite of this, the wiring boards as such can consist of several layers of wiring. It is also common that the antenna is located on the other side of the wiring board than the components that are soldered on the wiring board. If the wireless station meets both the conditions mentioned above, soldering the test switch described above on the same side of the wiring board with the wireless station's own antenna is not possible. Then the wireless station must be opened for servicing, for example, to enable the radio frequency power to be measured.

It is a purpose of the invention to provide a system by which it is possible to measure the properties of a radio frequency signal from a wireless station with no external antenna and/or antenna connection accurately enough. A second purpose of the invention is to provide a system by which the measurement can be carried out quickly and easily, preferably without dismantling the wireless station.

This first purpose can be achieved by forming a test switch on the wiring board of the wireless station, with a hole beneath the test switch in the wiring board. Through this hole, the test switch can be switched to the measuring position preferably with the measuring head, whereupon the wireless station's own antenna is disconnected to improve the accuracy of measurement. Then the radio frequency signal proceeds from the transmitter of the wireless station via the test switch and the measuring head to the testing equipment or to the opposite direction. When this switch is in the operating position, the radio frequency signal proceeds via the test switch to the wireless station's own antenna. The second purpose can be achieved by forming a testing hole, which is suitable for measuring the radio frequency power, also in the shell of the wireless station at the location of the test switch or in its vicinity.

To put it more accurately, the system according to the invention is characterized in what is set forth in the characterizing part of claim 1. In addition, the method according to the invention is characterized in what is set forth in the characterizing part of claim 11.

The present invention provides considerable advantages over the prior art methods. When the wireless station's own antenna can be disconnected for the duration of the measurement of the radio frequency signal, the measuring accuracy is considerably improved. When the test switch can be switched to the testing position from the other side of the wiring board of the wireless station than the one where this test switch is located, the test switch can be placed in a space protected with an RF shield. Then it is also much easier to place the components on one side of the wiring board of the wireless station only. In addition, if a testing hole has been formed on the shell of the wireless station, it is not necessary to dismantle the wireless station for measuring the radio frequency power. Thus the time needed for the measurement is substantially shorter, the measurement is very easy to carry out and the danger of sensitive parts in the wireless station being broken is much smaller than when using prior art solutions.

In the following, the invention will be described in more detail with reference to the accompanying drawings, in which.

Figure 1A:
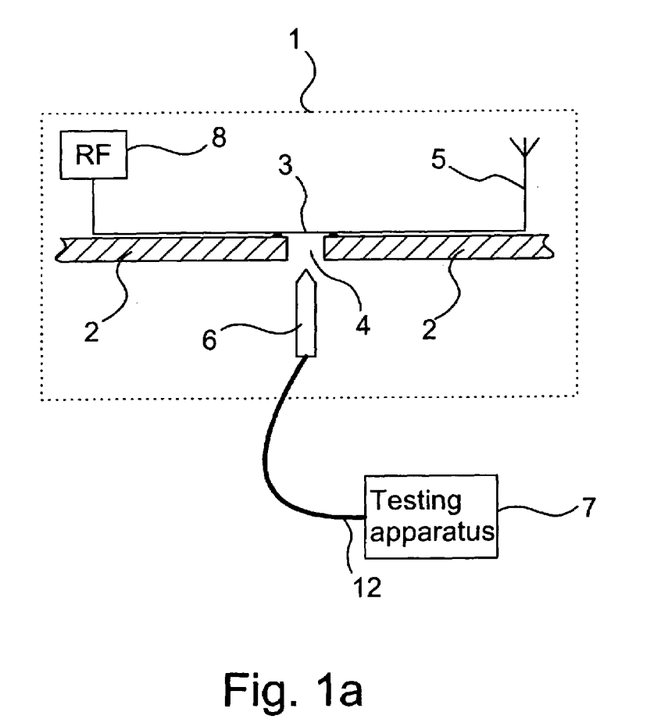
FIG. 1a shows a wireless station according to the invention with the test switch in the operating position, as a schematic drawing.
Figure 1B:
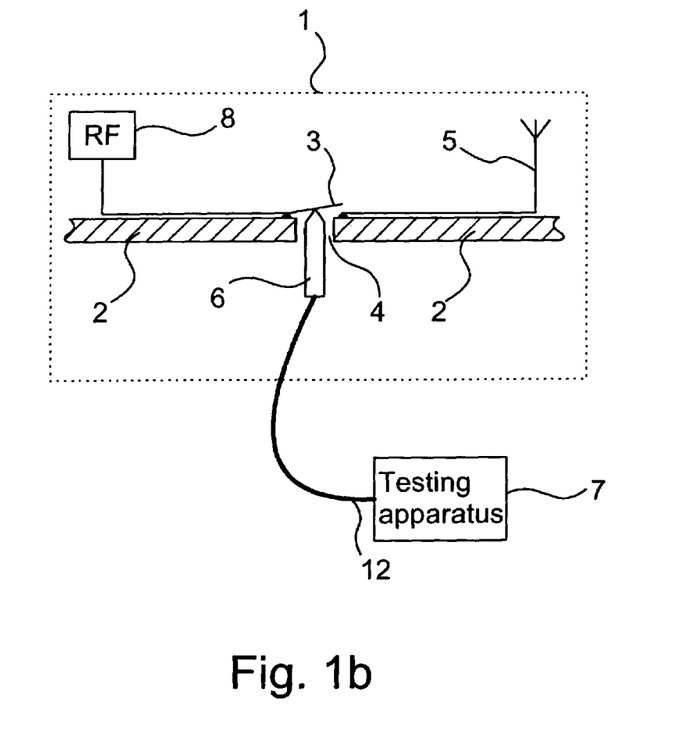
FIG. 1b shows the wireless station according to FIG. 1a with the test switch in the testing position, as a schematic drawing.

FIGS. 1a and 1b show a system according to the invention as a simplified drawing. This system preferably comprises at least a wireless station 1, a measuring head 6 and a testing apparatus 7. This testing apparatus preferably comprises at least means for measuring radio frequency power and means for feeding a radio frequency test signal. The wireless station preferably comprises at least a wiring board 2, switching means such as a test switch 3, an antenna 5 and a radio part 8. This test switch, which has two different positions, has been installed on the wiring board of the wireless station. When this test switch is in the first position, i.e. in the operating position, or closed (FIG. 1a), the radio frequency signal proceeds from the radio part 8 via the test switch 3 to the wireless station's own antenna 5.

When radio frequency power should be measured from the wireless station 1, this test switch 3 is switched to the second position, i.e. to the test position or open (FIG. 1b) preferably with the measuring head 6. In order to enable the test switch to be opened, there is provided in the wiring board 2, at least partly at the location of the test switch, a switching aperture 4, such as a hole or a corresponding opening, slot or the like through the wiring board, through which the test switch can be opened with the measuring head from a different side of the wiring board than where the test switch has been installed. Then the test switch can be sufficiently well protected from external interference. In addition, it also becomes much easier to place the components on one side of the wiring board of the wireless station only. When the test switch is switched open or in the testing position, the wireless station's own antenna 5 is disconnected to improve the accuracy of measurement. Then the radio frequency signal proceeds from the radio part 8 of the wireless station via the measuring head and cable 12 to the testing apparatus 7.

It is also possible that the test switch 3 is switched to the testing position through the switching aperture 4, but it is not done with the measuring head 6. Then the arrangement is preferably such that a testing connector (not shown) for the measuring head has been formed on the surface of the wireless station 1. The testing connector has been coupled to the test switch so that when the test switch is in the testing position, the measurement can be carried out through the testing connector. This testing connector can be located, for example, beside the bottom connector and charging connector of the wireless station on the bottom of the wireless station. When the measurement should be carried out, the measuring head is connected to this testing connector and the test switch is switched to the testing position preferably with an instrument suitable for this purpose.

Figure 2:
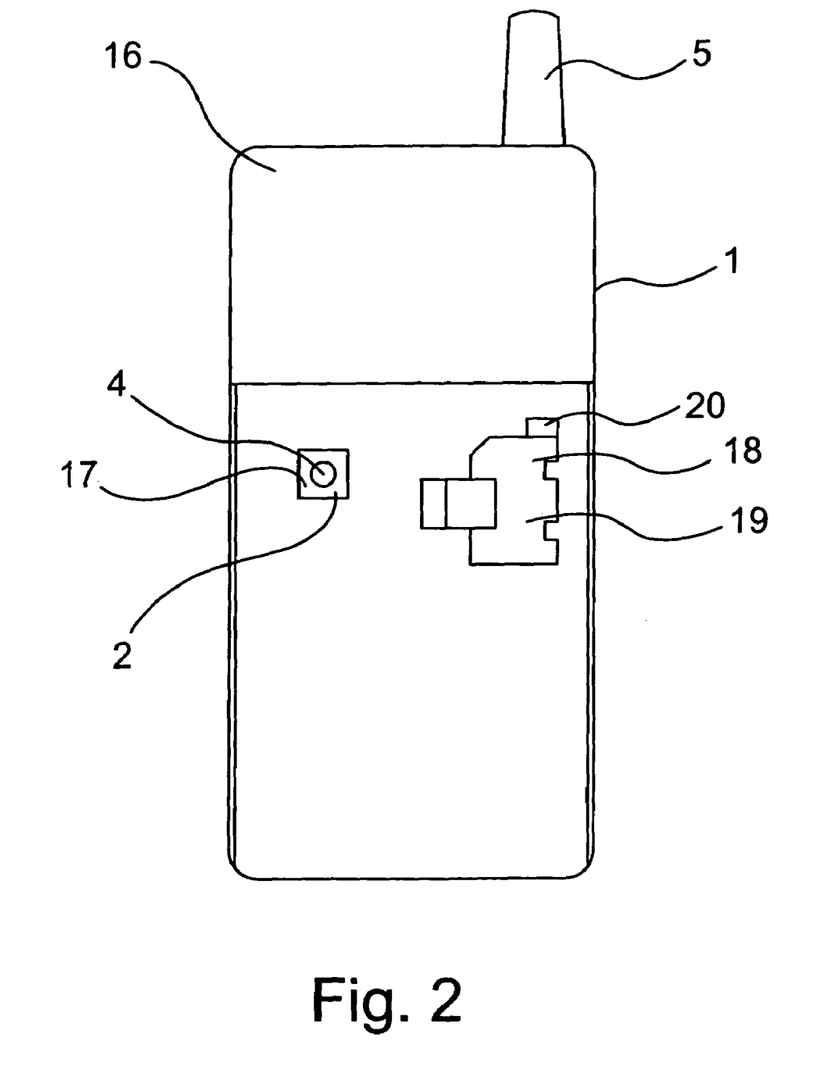
FIG. 2 shows the wireless station according to FIGS. 1a and 1b as seen from the back side.

In order to make the measurement of radio frequency power as quick and easy as possible, it should be possible to carry out the measurement without opening the shell 16 of the wireless station (FIG. 2), which would make the measurement a simple and quick operation. In addition, the danger of sensitive parts in the wireless station being broken is much smaller than in the case that the shell should be opened before carrying out the measurement. Because of this, a testing aperture 17 is preferably formed in the shell of the wireless station, conveniently so that it is essentially at the location of the switching aperture 4 formed in the wiring board 2. Through this testing aperture, the test switch 3 can be switched to the testing position and the testing apparatus can be coupled to the output of the radio part 8 of the wireless station. It is naturally clear that the testing aperture need not necessarily be located exactly at the hole formed in the wiring board, as long as it is possible to switch the test switch to the testing position (open) through the testing aperture and to the operating position (closed) and to couple the testing apparatus to the output of the radio part. The testing aperture has preferably been formed so that it is not visible when the wireless station is used. A place like this is, for instance, under the battery (not shown) of the wireless station, where it is protected from foreign, external objects and dirt. It is also possible that the testing aperture is not under the battery, in which case the testing aperture is preferably covered (not shown) with a protective sticker or rubber bung.

Figure 3:
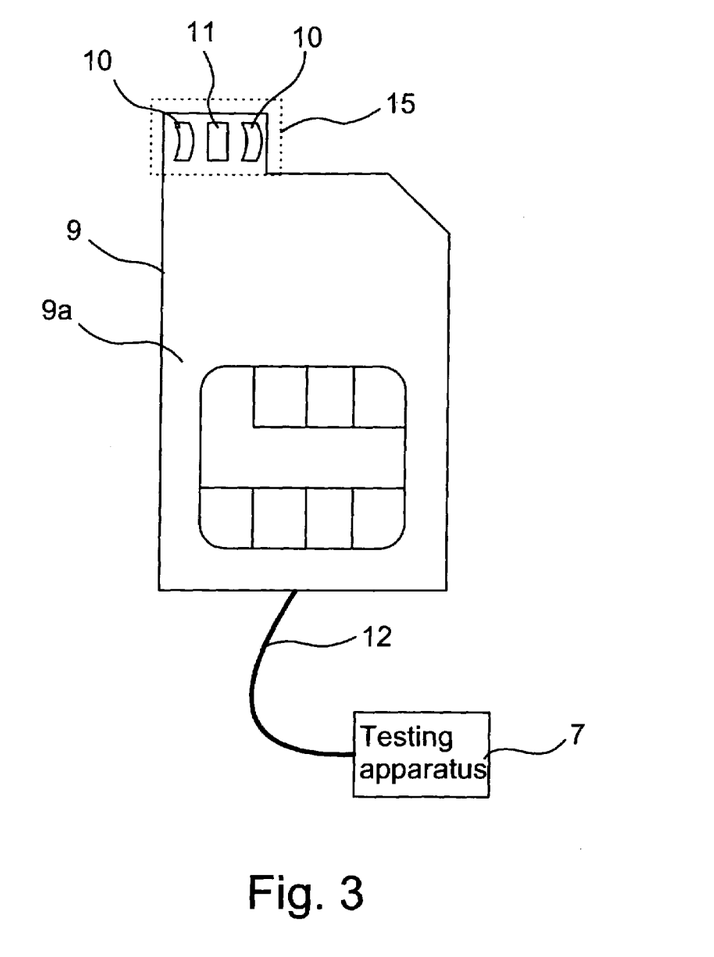
FIG. 3 shows a testing card to be coupled to the SIM card slot of the wireless station from the bottom.

One way of coupling the testing apparatus 7 to the output of the radio part 8 of the wireless station to advantage is to carry out the coupling by means of a separate testing card 9 (FIG. 3). This testing card is preferably installed in the place of the SIM card (Subscriber Identification Module) 18 of the wireless station for the duration of the measurement. In appearance, this testing card differs from an ordinary SIM card in that it has a projecting part 15, on which there are provided on the lower surface 9a of the testing card, the surface which is placed against the wiring board 2 of the wireless station, grounding means 10, such as springs, and a measuring connection 11. In addition, the testing card is coupled to the testing apparatus 7 by means of a cable 12. The testing card can also contain all the properties of an ordinary SIM card to enable the wireless station to be used during the measurement of the radio frequency power. The testing card can contain, for example, a microprocessor and memory for saving the PIN code (Personal Identification Number), for example. In this case, the above mentioned testing aperture 17 is an extension 20 of the SIM card slot, and thus the test switch 3 and the hole 4 formed in the wiring board 2 are located essentially at the extension of the SIM card slot 19.

Figure 4:
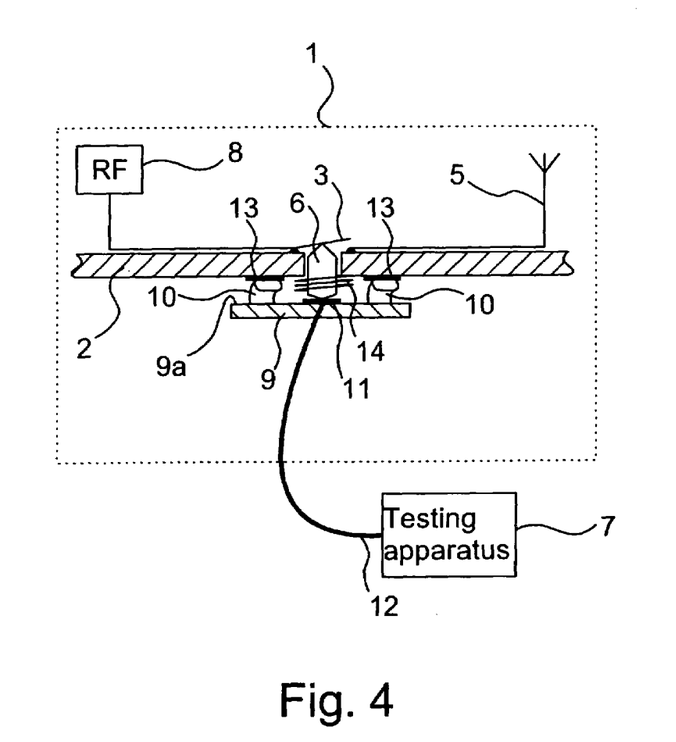
FIG. 4 shows a wireless station according to the invention, in which a testing card according to FIG. 3 is used, as a schematic diagram.

When the above mentioned testing card 9 has been installed in the SIM card slot 19 of the wireless station 1 so that the lower surface 9a of the testing card is against the wiring board 2 of the wireless station (FIG. 4), the test switch 3 is on a different side of the wiring board than the testing card. The shape of the testing card also prevents it from being installed incorrectly in the SIM card slot. When installed in the SIM card slot, the testing card pushes the measuring head 6 upwards, whereupon the measuring head keeps the test switch 3 in the testing position. In this case, the measuring head has been placed as fixed in the wireless station, and thus the measuring head is coupled to the testing apparatus by means of the testing card. An ordinary SIM card 18 does not switch the test switch to the testing position, because it does not have a projecting part corresponding to the projecting part 15 of the testing card, which would open the test switch. The grounding means on the testing card are at least partly at the location of one or more grounding connections 13 on the wiring board of the wireless station. In addition, the measuring head touches the measuring connection 11 of the testing card and the test switch, whereupon the radio frequency signal proceeds from the radio part 8 via the switch 3, measuring head 6, measuring surface 11, testing card 9 and the cable 12 to the testing apparatus 7. When the testing card is removed from the wireless station, the measuring head is returned to the lower position by means of a return spring 14, for example, whereupon the test switch is closed, i.e. returns to the operating position. The radio frequency signal proceeds again from the radio part via the switch to the wireless station's own antenna 5.

Figure 5:
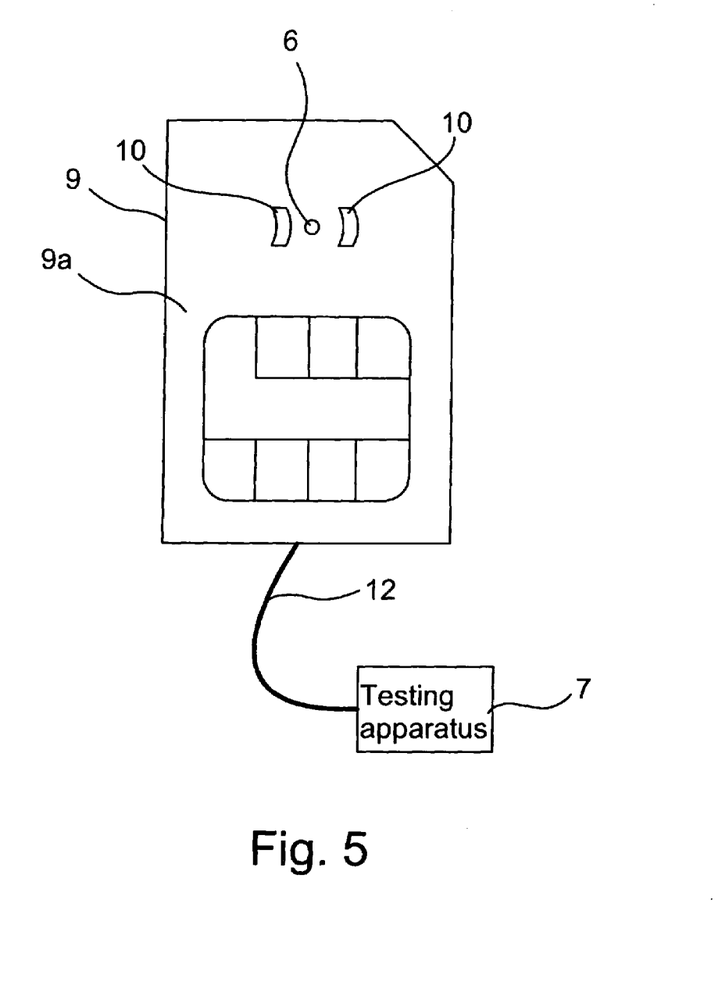
FIG. 5 shows another testing card to be coupled to the SIM card slot of the wireless station from the bottom.

It is also possible that the testing card 9 (FIG. 5) does not have the projecting part 15 mentioned above. Then the appearance of this testing card differs from an ordinary SIM card in that there are provided on the lower surface 9a of the testing card, i.e. the surface that is placed against the wiring board 2 of the wireless station, grounding means 10, such as springs, and a measuring head 6. In addition, the testing card is coupled to the testing apparatus 7 by means of a cable 12. Even in this case, the testing card can also contain all the properties of an ordinary SIM card to enable the wireless station to be used during the measurement of the radio frequency power. In this case, the above mentioned testing aperture 17 is in the SIM card slot 19, and thus the test switch 3 and the hole 4 formed in the wiring board 2 are located essentially at this testing aperture.

Figure 6:
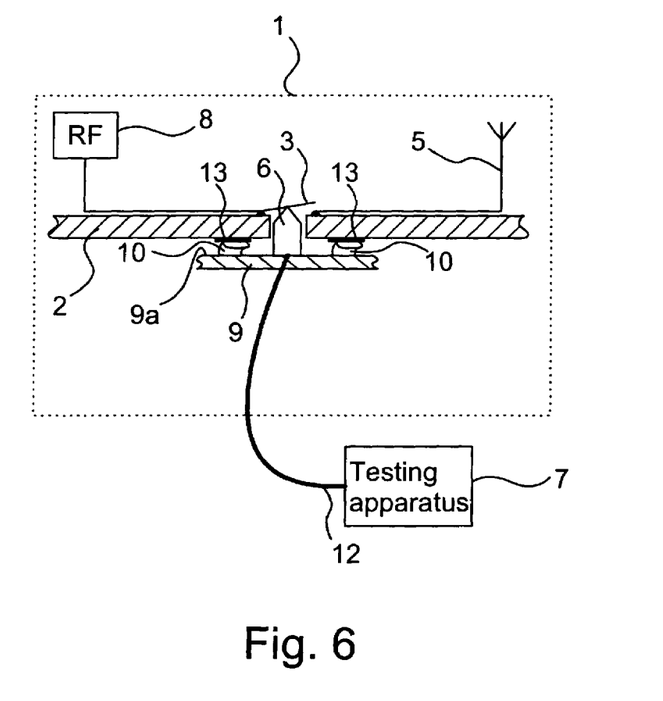
FIG. 6 shows wireless station according to the invention, in which a testing card according to FIG. 5 is used, as a schematic diagram.

When the above mentioned testing card 9 has been installed in the SIM card slot 19 of the wireless station 1 so that the lower surface 9a of the testing card is against the wiring board 2 of the wireless station (FIG. 6), the testing switch 3 is on a different side of the wiring board than the testing card. When installed in the SIM card slot, the measuring head 6 in the testing card keeps the test switch 3 in the testing position. An ordinary SIM card 18 does not switch the test switch to the testing position, because it does not have the measuring head 6 of the testing card, which would open the test switch. The grounding means on the testing card are at least partly at the location of one or more grounding connections 13 on the wiring board of the wireless station. When this testing card is installed, the radio frequency signal proceeds from the radio part 8 via the switch 3, measuring head 6, testing card 9 and cable 12 to the measuring apparatus 7. When the testing card is removed from the wireless station, the test switch is closed, i.e. returns to the operating position. The radio frequency signal proceeds again from the radio part via the switch to the wireless station's own antenna 5.

It is naturally clear that the radio frequency power can also be measured by some other means than a testing card 9 installed in the SIM card slot 19. For example, it is possible to form a dedicated place for the above mentioned testing card 9 in the wireless station for measurement.

The essential feature of this method according to a preferred embodiment of the invention is the fact that the switching of the test switch to the testing position takes place on a different side of the wiring board 2 of the wireless station than where the test switch 3 is located. In addition, it is essential that the measurement is carried out without removing the shell 16 of the wireless station.

Figure 7:
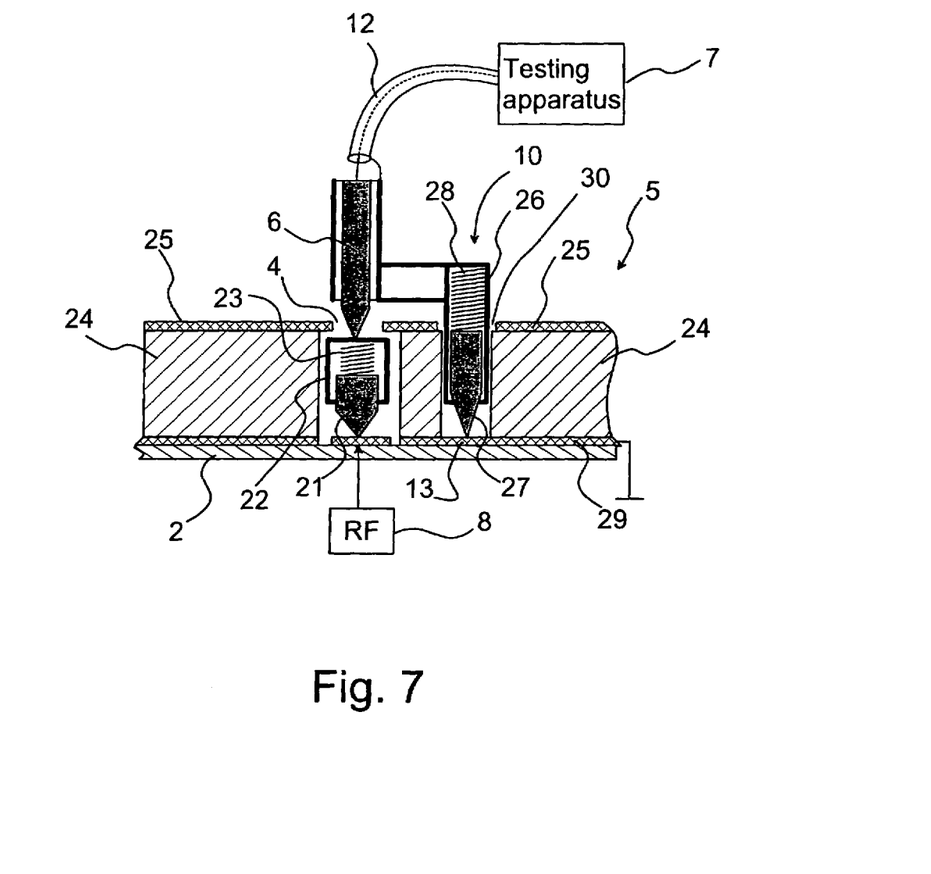
FIG. 7 shows still another wireless station according to the invention with the test switch in the testing position, as a schematic drawing.

FIG. 7 shows a system according to still another embodiment of the invention as a simplified drawing. In this embodiment the antenna is e.g. a so called PIFA type, wherein it comprises an antenna plate 25 and a spacer plate 24. RF power is connected to the antenna 5 by means of a power feeding pin 21. This power feeding pin 21 also comprises a first housing 22 and first loading means, e.g. a first spring 23, which ensures a good contact between the power feeding pin and the output of the radio part 8 of the wireless station. The first housing 22 is arranged to be movable substantially vertically. When the wireless station is in normal use, the first housing is 22 in contact with the antenna plate 25 and the power feeding pin 21 is in contact with the output of the radio part 8. The first housing 22 is made of electrically conducting material, wherein the radio frequency signal from the radio part 8 is coupled to the antenna plate 25. In a testing situation the testing probe 6 is situated on the hole 4 and pushed downwards, wherein the testing probe 6 pushes the first housing 22 downwards and disconnects the first housing 22 from the antenna plate 25. The radio frequency signal from the radio part 8 is now connected to the testing probe 6 instead of the antenna plate 25. The testing probe further comprises grounding means 10, which advantageously comprise a second housing 26, grounding pin 27 and second loading means, e.g. a second spring 28. The grounding means 10 are arranged with the testing probe 6 for providing a proper grounding connection for the testing apparatus while the testing probe 6 is connected to the first housing 22. For that purpose the antenna plate 25 comprises an opening 30 through which the grounding pin 27 is able to make contact with the ground plane 29 e.g. at grounding connection 13.

In the above description, the invention was applied to a transmitter of the radio part 8, but it is naturally clear that the invention can be applied to a receiver as well. Tuning and measurement operations are also carried out for receivers, in which case measuring accuracy is an important consideration. A certain test signal is then fed to the radio part 8 from a testing apparatus 7, whereupon the required measurements can be carried out from the receiver. In this case the test switch 3 is also switched to the testing position, in which the radio frequency test signal being fed does not proceed to the antenna. This switching is preferably carried out with another measuring head (not shown), whereupon the radio frequency test signal proceeds from the testing apparatus 7 via the cable 12 and the test switch 3 to the receiver of the radio part. The measurement is preferably carried out through a testing connector (not shown) provided on the surface of the wireless station, on which the measuring head 6 can be fitted, whereby the wireless station need not be dismantled for the duration of the measurement. The testing connector has been coupled to the test switch so that when the test switch is in the testing position and a certain radio frequency test signal is being fed from the testing apparatus, the measurement can be carried out through the testing connector.

When an amplifier and a testing card are involved, there are preferably two measuring heads 6, of which the first or second one switches the test switch to the testing position directly or indirectly, when the testing card is inserted into the wireless station for carrying out the measurement. Then a certain radio frequency test signal is fed to the receiver through the first measuring head, and the measurement is carried out through the second measuring head.

Although the invention was described above with reference to the measurement of power, it is obvious that in addition to the measurement of radio frequency power, the invention can also be used for the measurement of other properties of a radio frequency signal. The property to be measured can be frequency, sensitivity, bit error rate or modulation spectrum, for example.

The present invention is not limited to the above described embodiments only, but its details can be modified without departing from the scope defined by the attached claims.

What is claimed is:

1. A system for measuring a radio frequency signal in a wireless station (1), whereby the system comprises at least testing equipment (6, 7, 12), the testing equipment comprises at least a testing apparatus (7), a measuring head (6) and means (12) for transmitting electrical signals between said testing apparatus (7) and measuring head (6), and the wireless station (1) comprises at least one radio part (8), a wiring board (2), an antenna (5) and a switching means (3, 22), which has at least a first position, in which the radio frequency signal is arranged to be directed between the radio part (8) of the wireless station (1) and the antenna (5), and a second position, in which the radio frequency signal is arranged to be directed between the radio part of the wireless station and the testing apparatus (7) via said switching means (3, 22) and the measuring head (6), characterized in that a switching aperture (4) is provided in the wiring board (2) at least partly at the location of said switching means (3, 22), through which aperture said switching means (3, 22) is arranged to be switched to the second position.

2. A system according to claim 1, characterized in that a property of the radio frequency signal, such as power, frequency, sensitivity, bit error rate or modulation spectrum, which has an effect on the performance, is arranged to be measured.

3. A system according to claim 1, in which the wireless station (1) also comprises at least a shell (16), characterized in that a testing aperture (17) is provided in said shell (16) at least partly at the location of the switching aperture (4), through which testing aperture (17) and switching aperture (4) said switching means (3, 22) is arranged to be switched to the second position.

4. A system according to claim 1, characterized in that said switching means (3, 22) is arranged to be switched to the second position with the measuring head (6).

5. A system according to claim 4, chacterized in that the measuring head (6) also comprises grounding means (10) for providing a grounding connection for the testing apparatus (7) while the testing probe (6) is connected to said switching means (3, 22).

6. A system according to claim 1, whereby the wireless station (1) comprises at least one grounding connection (13) on the wiring board (2), characterized in that the system also comprises at least a testing card (9) and means (19) for coupling the testing card to the wireless station, which testing card (9) is coupled to the testing apparatus (7) with said means (12) for transmitting electrical signals, which testing card (9) is arranged to be placed in said means (19) for coupling the testing card to the wireless station, that the measuring head (6) is installed in a testing aperture (4) formed in the wiring board (2) of the wireless station (1), that said testing card (9) comprises at least mode switching means (15), one grounding connection (10) and a measuring connection (11), and the mode switching means (15) are arranged to push said switching means (3, 22) to the second position by means of the measuring head (6), whereupon the grounding means (10) are coupled to an electrically conductive connection in the grounding connection (13), the measuring head (6) is coupled to an electrically conductive connection in said switching means (3, 22) and the measuring head (6) is coupled to an electrically conductive connection in the measuring connection (11), whereupon the radio frequency signal is directed between the radio part (8) of the wireless station (1) and the testing apparatus (7) via said switching means (3, 22), measuring head (6) and testing card (9).

7. A system according to claim 6, in which the wireless station (1) comprises at least a measuring head returning device (14), chacterized in that the measuring head (6) is installed in a switching aperture (4) formed in the wiring board (2) so that when the testing card (9) is removed from the SIM card slot (19), the measuring head is released by means of the measuring head returning device (14), such as a spring, whereupon said switching means (3, 22) returns to the first position.

8. A system according to claim 1, whereby the wireless station (1) comprises at least one grounding connection (13) on the wiring board (2), characterized in that the system also comprises at least a testing card (9) and means (19) for coupling the testing card to the wireless station, the testing card (9) is coupled to the testing apparatus (7) with said means (12) for transmitting electrical signals, the testing card (9) is arranged to be placed in said means (19) for coupling the testing card to the wireless station for carrying out the measurement, that said testing card (9) comprises at least one measuring head (6) and a grounding connection (10), and the measuring head (6) is arranged to switch said switching means (3, 22) to the second position, whereupon the grounding means (10) are coupled to an electrically conductive connection in the grounding connection (13) and the measuring head (6) is connected to an electrically conductive connection in said switching means (3, 22), whereupon the radio frequency signal is directed between the radio part (8) of the wireless station (1) and the testing apparatus (7) via said switching means (3, 22), measuring head (6) and the testing card (9).

9. A system according to claim 6, whereby the wireless station (1) comprises at least one SIM card (18), characterized in that the above mentioned means (19) for coupling the testing card to the wireless station comprise at least one SIM card slot (19), into which the SIM card (18) is arranged to be placed, and the above mentioned testing card (9) is arranged to be placed instead of the SIM card (18) in the SIM card slot (19).

10. A system according to claim 9, characterized in that the testing card (9) comprises means for implementing at least one functional property of the SIM card (18), such as a microprocessor and memory.

11. A method for measuring a radio frequency signal in a wireless station (1), whereby radio frequency power is measured by means of testing equipment (6, 7, 12), the testing equipment comprises at least a testing apparatus (7), a measuring head (6) and means (12) for transmitting electrical signals between said testing apparatus (7) and measuring head (6), and the wireless station (1) comprises at least one radio part (8), a wiring board (2), an antenna (5) and switching means (3, 22), which has at least an first position, in which the radio frequency signal is directed between the radio part (8) of the wireless station (1) and the testing apparatus (7) via said switching means (3, 22) and the measuring head (6), characterized in that a switching aperture (4) is formed in the wiring board (2) at least partly at the location of said switching means (3, 22), through which aperture said switching means (3, 22) is switched to the second position.

12. A method according to claim 11, characterized in that a property of the radio frequency signal, such as power, frequency, sensitivity, bit error rate or modulation spectrum, which has an effect on the performance, is measured.

13. A method according to claim 11, whereby the wireless station (1) also comprises at least a shell (16), characterized in that a testing aperture (17) is formed in said shell (16) at least partly at the location of the switching aperture (4), through which testing aperture (17) and switching aperture (4) said switching means (3, 22) is switched to the second position.

14. A method according to claim 11, characterized in that for carrying out the measurement, said switching means is switched to the second position with the measuring head (6).

15. A method according to claim 11, whereby the wireless station (1) comprises at least one grounding connection (13) on the wiring board (2), characterized in that the testing equipment (6, 7, 12) mentioned above also comprises at least a testing card (9) and means (19) for coupling the testing card to the wireless station, the testing card (9) is coupled to the testing apparatus (7) with said means (12) for transmitting electrical signals, and the testing card (9) is placed in said means (19) for coupling the testing card to the wireless station for carrying out the measurement, that said testing card (9) comprises at least mode switching means (15), one grounding connection (10) and a measuring connection (11), and when the testing card (9) is installed, the mode switching means (15) push said switching means (3, 22) to the second position by means of the measuring head (6) in the switching aperture (4) in the wiring board (2) of the wireless station (1), the grounding means (10) are coupled to an electrically conductive connection in the grounding connection (13), the measuring head (6) is coupled to an electrically conductive connection in said switching means (3, 22) and the measuring head (6) is coupled to an electrically conductive connection in the measuring connection (11), whereupon the radio frequency signal is directed between the radio part (8) of the wireless station (1) and the testing apparatus (7) via the measuring head (6) and testing card (9).

16. A method according to claim 15, in which the wireless station (1) comprises at least a measuring head returning device (14), characterized in that the measuring head (6) is installed in a switching aperture (4) formed in the wiring board (2) so that when the testing card (9) is removed from the SIM card slot (19), the measuring head is released by means of the measuring head returning device (14), such as a spring, whereupon said switching means (3, 22) returns to the first position.

17. A method according to claim 11, whereby the wireless station (1) comprises at least a SIM card (18), a SIM card slot (19) in which the SIM card (18) is placed, and at least one grounding connection (13) on the wiring board (2), characterized in that the testing equipment (6, 7, 12) mentioned above also comprises at least a testing card (9) and means (19) for coupling the testing card to the wireless station, which testing card (9) is coupled to the testing apparatus (7) with said means (12) for transmitting electrical signals, which testing card (9) is placed in said means (19) for coupling the testing card to the wireless station for carrying out the measurement, that said testing card (9) comprises at least one measuring head (6) and a grounding connection (10), and when the testing card (9) is installed, the measuring head (6) switches said switching means (3, 22) to the second position, the grounding means (10) are coupled to an electrically conductive connection in the grounding connection (13), and the measuring head (6) is coupled to an electrically conductive connection in said switching means (3, 22), whereupon the radio frequency signal is directed between the radio part (8) of the wireless station (1) and the testing apparatus (7) via the measuring head (6) and testing card (9).

18. A method according to claim 15, whereby the wireless station (1) comprises at least one SIM card (18), characterized in that the above mentioned means (19) for coupling the testing card to the wireless station comprise at least one SIM card slot (19), in which the SIM card (18) is placed, whereupon the above mentioned testing card (9) is placed instead of the SIM card (18) in the SIM card slot (19) for carrying out the measurements.

19. A method according to claim 18, characterized in that the testing card (9) comprises means for implementing at least one functional property of the SIM card (18), such as a microprocessor and memory.

20. A system for measuring a radio frequency signal in a wireless station comprising:

a radio part coupled to an antenna in the wireless station;

a switching device mounted on one side of a wiring board in the wireless station and an aperture formed on the other side of the wiring board allowing the switching device to be accessed to switch from a first position to a second position, the switching device, when in the first position being electrically connected to the antenna and when in the second position being electrically connected to the measuring head;

a testing card adapted to be received in the wireless station, the testing card including a projecting part;

a measuring head coupled to a testing apparatus, the measuring head adapted to be received in the aperture formed in the wiring board and contact the switching device when the test card is received in the wireless station.

21. The system of claim 20 further comprising a housing for the wireless station with an aperture formed in the housing of the wireless station corresponding in location to the aperture formed in the wiring board, the aperture adapted to receive the measuring head.

* * * * *